United States Patent [19]

Alexander

[11] Patent Number: 5,271,962
[45] Date of Patent: Dec. 21, 1993

[54] METALLIC COMPOSITION AND METHODS FOR MAKING AND USING THE SAME

[75] Inventor: John H. Alexander, Goleta, Calif.

[73] Assignee: Ferro Corporation, Cleveland, Ohio

[21] Appl. No.: 915,895

[22] Filed: Jul. 17, 1992

Related U.S. Application Data

[62] Division of Ser. No. 492,540, Mar. 12, 1990, Pat. No. 5,152,931.

[51] Int. Cl.⁵ .............................. B05D 3/02
[52] U.S. Cl. ................................... 427/229
[58] Field of Search ............... 427/229; 428/446, 698; 106/1.13, 1.14, 1.15; 501/88, 98, 97, 96; 252/578; 156/89

[56] References Cited

U.S. PATENT DOCUMENTS

| | | | |
|---|---|---|---|
| 4,493,789 | 1/1985 | Ueyama et al. | 252/514 |
| 4,525,387 | 6/1985 | Ebata et al. | 427/190 |
| 4,690,872 | 9/1987 | Kato et al. | 428/446 |
| 4,840,853 | 6/1989 | Iio et al. | 428/698 |
| 4,892,703 | 1/1990 | Iio et al. | 419/13 |
| 4,952,902 | 8/1990 | Kawaguchi et al. | 338/22 |
| 4,957,561 | 9/1990 | Esashi | 106/286.3 |
| 5,011,530 | 4/1991 | Kondo et al. | 106/1.13 |

*Primary Examiner*—Karl Group
*Assistant Examiner*—A. Wright
*Attorney, Agent, or Firm*—Rankin, Hudak & Hill

[57] ABSTRACT

The invention provides a metallic composition and methods for making and using the same. In a preferred embodiment the metallic composition forms a conductor path and is bonded to a substrate of aluminum nitride. The metallic composition comprises Mo, Si, Cu and Mn. The Si may be present in the metallic composition as $MoSi_2$. The metallic composition may be produced by firing a paste that has been applied to a substrate of aluminum nitride. The paste comprises an organic vehicle and a metallic powder. The metallic powder preferably comprises about 60% to about 90% by weight Mo, about 0.5% to about 15% by weight $MoSi_2$, about 5% to about 20% Cu and up to about 20% by weight Mn.

9 Claims, 1 Drawing Sheet

METALLIC COMPOSITION AND METHODS FOR MAKING AND USING THE SAME

RELATED APPLICATION

This application is a divisional of U.S. patent application Ser. No. 07/492,540 filed Mar. 12, 1990 also entitled "Metallic Composition and Methods for Making and Using The Same" which issued as U.S. Pat. No. 5,152,931 on Oct. 6, 1992.

This invention relates to metallizing, and specifically to the metallic composition which forms the metallic layer upon a substrate. More particularly, the invention relates to a metallic composition which forms an electrically conductive path on an aluminum nitride substrate.

BACKGROUND

Most electronic devices such as, for example, computers, televisions, radio receivers and amplifiers include electrical circuits having electronic circuit boards. In many of these electronic devices the circuit boards comprise a dielectric substrate having a conductor path formed thereon. With respect to many of these prior art circuit boards the dielectric substrate may comprise alumina ($Al_2O_3$) or beryllium oxide (BeO) and the conductor path may be formed on the substrate utilizing such metals as titanium (Ti), molybdenum (Mo) and manganese (Mn). Such conductor paths are generally formed upon the dielectric substrates by first producing a conductor paste and then applying the paste to the dielectric substrate utilizing conventional application techniques such as screen printing, spraying or brushing. The coated dielectric substrate is then heated in an oven so as to sinter and bond the metallic constituents of the paste to the dielectric substrate thereby forming a conductor path upon the dielectric substrate. Attached to the conductor path may be various electronic components such as, for example, capacitors, diodes, rectifiers and various types of semiconductor devices. Such electronic components, depending on the particular metal(s) used to form the conductor path, may be attached utilizing various bonding techniques such as brazing, soldering, wire bonding or tab bonding.

During the operation or use of electronic devices having circuit boards the electronic components of the circuit boards generate heat. In many applications, the removal of the heat generated by the electronic components is of paramount importance. Specifically, the presence of excessive heat and the corresponding elevated temperatures that result from excessive heat build-up in the electronic components of a circuit board can temporarily alter or permanently damage the electrical characteristics of the electronic components.

One method of preventing excessive heat build-up in electronic circuits is to construct the circuit board utilizing a dielectric substrate having a high thermal conductivity. Such a dielectric substrate serves to dissipate the heat generated by the electrical components thereby helping to prevent the heat from altering or otherwise detrimentally affecting the electronic components of the circuit board. In addition to being a good thermal conductor, preferably the dielectric also displays a thermal coefficient of expansion that is closely related to silicon (Si), the material from which many electronic components are produced. This allows the dielectric substrate and the electronic components to expand at similar rates as heat is being generated by the electronic components thereby minimizing the possibility of an electrical break or short forming in the circuit board.

A dielectric material that displays excellent thermal conductivity and a thermal coefficient of expansion similar to that of Si is aluminum nitride (AlN). Thus, from the standpoint of helping to avoid excessive heat build-up and minimizing the possibility of an electrical break or short, aluminum nitride is a desirable material for the construction of circuit boards. However, in the prior art when a circuit board is produced utilizing aluminum nitride, many times the bond formed between the aluminum nitride substrate and the conductor path has been less than ideal. More particularly, some such prior art circuit boards have displayed adhesion strengths of less than about 5,000 psi between the aluminum nitride substrate and the conductor path. This low bond strength has been found to be somewhat unacceptable for many applications. More particularly, when the conductor path separates from the aluminum nitride substrate due to poor adhesion between the conductor path and the substrate, electrical breaks or shorts are likely to develop in the circuit board. Generally, adhesion strengths in excess of 8,000 psi are preferred.

Some prior art circuit boards constructed with aluminum nitride have displayed acceptable adhesion strengths between the substrate and the conductor. Such conductor paths have been produced utilizing titanium nitride (TiN), Mo and tungsten (W). However, such prior art circuit boards have required during their production very high firing temperatures (e.g., temperatures in excess of 1800° C.) in order to create a suitable bond between the conductor path and the substrate.

Other prior art circuit boards that display acceptable adhesion strengths between the aluminum nitride substrate and the conductor are those wherein the conductor is formed utilizing silver (Ag), palladium (Pd) or gold (Au). However, when attaching electronic components to circuit boards employing these particular conductor metals, it is not possible to utilize high temperature bonding techniques such as brazing.

SUMMARY OF INVENTION

The present invention provides a new and useful metallic composition and method for making and using the same. In one preferred embodiment the metallic composition provides an electrically conductive path upon a dielectric substrate comprising aluminum nitride. The metallic composition affords excellent adhesion strengths between the metallic composition and the aluminum nitride substrate utilizing firing temperatures around 1400° C. More particularly, adhesion strengths in excess of 8,000 psi have been achieved between the metallic composition and aluminum nitride utilizing firing temperatures between about 1375° C. and 1425° C. With the addition of copper (Cu) to the metallic composition good adhesion strengths have been produced using firing temperatures as low as about 1250° C. The metallic composition also provides excellent electrical and thermal conductivity. Furthermore, the metallic composition provides an excellent base for the subsequent plating of nickel and precious metals such as silver or gold, and facilitates the use of various bonding techniques for the attachment of electronic components including high temperature bonding techniques such as brazing.

The metallic composition may be formed by first producing a paste. The paste comprises a mixture of a metallic powder and an organic vehicle. The metallic powder comprises Mo and Si. Preferably, the metallic powder comprises Mo, Si, Cu and Mn. More preferably, the metallic powder comprises a mixture of Mo, molybdenum disilicide ($MoSi_2$), Cu and up to about 20% by weight Mn. As-used in this specification and the claims all percentages (%), unless otherwise indicated, are expressed in weight percents. Also, all temperatures used in this specification and the claims, unless otherwise indicated, are in degrees Celsius (° C.).

Preferably, the metallic powder comprises about 60% to about 90% Mo, about 5% to about 20% Cu, about .5% to about 15% $MoSi_2$ and up to about 20% Mn. More preferably, the metallic powder comprises about 67% Mo, about 6% $MoSi_2$, about 16% Cu and about 11% Mn. The metallic powder can have an average particle size of less than about 2 microns, and preferably less than about 1.5 microns. The organic vehicle includes a binder and a solvent. Preferably, the organic vehicle comprises a mixture of ethylcellulose and terpineol. Preferably, when producing the paste the metallic powder comprises about 80% to about 88% of the paste.

Once the paste is produced it is then applied to the aluminum nitride substrate using any one of a variety of conventional application techniques. The coated aluminum nitride substrate is then dried until the solvent contained in the paste has been substantially removed from the paste. The coated aluminum nitride substrate is then placed into a heating device having a atmosphere comprising at least one inert gas and a source of oxygen. Preferably, the inert gas comprises nitrogen gas ($N_2$) with less than about 100 parts per million (ppm) water ($H_2O$), and a hydrogen ($H_2$) to $H_2O$ ratio in excess of about 20:1.

The coated aluminum nitride substrate is retained in the oven and heated until it reaches an equilibrium temperature of more than about 1375° for a sufficient period of time so as to form the metallic composition and bond it to the aluminum nitride substrate. Preferably, the coated aluminum nitride is held at an equilibrium temperature of between about 1375° and about 1425° for at least about one hour. When the paste includes Cu, the coated aluminum nitride substrate is held at an equilibrium temperature of between 1250° C. and 1275° C. for about 1 hour.

The metallic composition displays a chemical composition similar to that of the metallic powder utilized to produce the paste. Specifically, the metallic composition comprises Mo, Si, oxygen and up to about 20% Mn. More preferably, the metallic composition comprises Mo, Si, Cu, oxygen and up to about 20% Mn. Preferably, the metallic composition comprises about 60% to about 90% to about .5% to about 15% Si, about 5% to about 20% Cu, up to about 20% Mn and oxygen.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION

Figure 1:
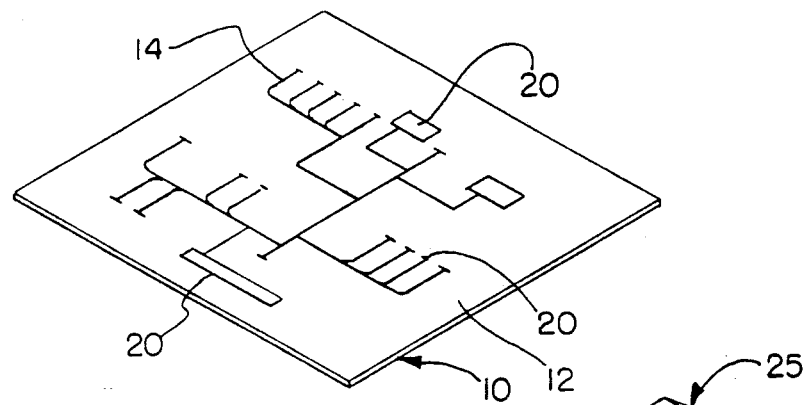
FIG. 1 is a perspective view of a electronic circuit board made in accordance with the principles of the present invention.
Figure 3:
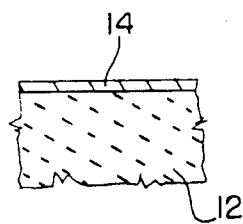
FIG. 3 is a magnified broken away cross-sectional view of the circuit board shown in FIG. 1.
Figure 2:
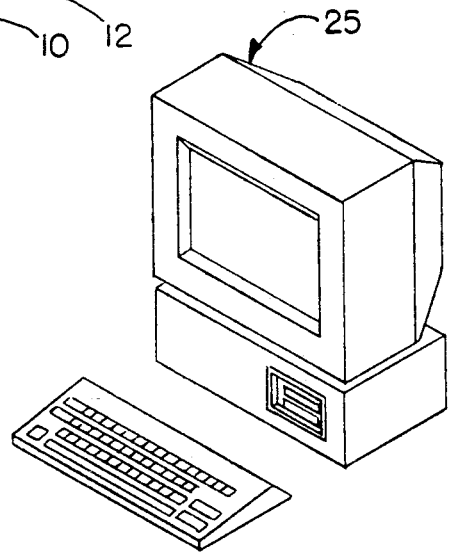
FIG. 2 is a perspective view of a electronic device including an electrical circuit having a circuit board like that shown in FIG. 1.

Referring to the drawings and initially to FIGS. 1-3 there is illustrated a circuit board 10 made in accordance with the principles of the present invention. As used in this specification and the claims, the term "circuit board" is to be afforded the broadest possible interpretation including, for example, hybrid integrated circuits or integrated circuit packages.

Circuit board 10 comprises a dielectric substrate 12 and a metallic composition 14 bonded to the dielectric substrate 12. The metallic composition 14 forms a conductive path upon the dielectric substrate 12. Attached to the metallic composition 14 are a plurality of electronic components 20, such as, for example, rectifiers, capacitors, resistors and various semi-conductor devices. Circuit board 10 is suitable for use in any one of a variety of electronic devices including the computer 25 shown in FIG. 2, or for example, such electronic devices as transmitters, receivers, amplifiers, recorders, controllers, converters, power supplies, television or video cameras.

The dielectric substrate 12 preferably comprises aluminum nitride. Aluminum nitride, produced by numerous manufacturers and displaying various different physical properties, has been successfully used in practicing the present invention. An example of an aluminum nitride substrate suitable for use in the present invention is a substrate distributed under the trademark KERASTRATE by the Keramont Corporation of 4231 South Fremont Avenue, Tuscon, Arizona 85714. This particular aluminum nitride substrate displays a chemical purity in excess of about 98%, a thermal conductivity of between about 160 and 190 watts/meter oKelvin (W/mK) and a dielectric constant at 1 megahertz (MHz)of about 8.6.

Circuit board 10 is produced by first formulating a conductor paste. The conductor paste comprises a mixture of metallic powder and an organic vehicle. The metallic powder comprises Mo, Si and Mn. Preferably, the metallic powder comprises Mo, Si, Cu and Mn. Preferably, the metallic powder comprises Mo, $MoSi_2$, Cu and up to about 20% Mn. More preferably, the metallic powder comprises about 60% to about 90% Mo, about 5% to about 20% Cu, about .5% to about 15% $MoSi_2$ and up to 20% Mn. More preferably, the metallic powder comprises about 67% Mo, about 6% $MoSi_2$, about 16% Cu and about 11% Mn. The organic vehicle comprises a mixture of a binder and a solvent. Examples of suitable binders are ethylcellulose, polyvinyl butyral, or an acrylate resin (e.g., methyl methacrylate. Examples of suitable solvents are diethylene glycol monobutyl ether; 2,4,4- trimethyl-1, 3-pentanediol monoisobutylrate; N-methyl-2-pyrrolidone; aliphatic alcohols, and esters of such alcohols, for example, the acetates and propionates; terpenes such as pine oil and terpineol; solutions of resins such as the polymeth acrylates of lower alcohols; the monobutyl ether of ethylene glycol monoacetate, or butyl carbitol acetate. Preferably, the organic vehicle comprises a mixture of ethylcellulose and terpineol.

The metallic powder is first produced by milling the constituents of the metallic powder (i.e., the Cu, Mo, $MoSi_2$, Si, and Mn) in a conventional ballmill in the presence a suitable solvent such as, for example, aromatic compounds such as xylene, toluene, methyl vinyl carbinol and benzene; ketones such as acetone or methyl ethyl ketone; halogenated hydrocarbons such as 1, 1, 1-trichlorethane, tetrachloroethylene, methylene chloride and fluorocarbons; saturated alcohols such as methyl alcohol, ethyl alcohol, n-propyl alcohol, n-butyl alcohol, n-pentyl alcohol, n-hexyl alcohol, isobutyl alcohol, sec-butyl alcohol, tert-butyl alcohol, isopentyl alcohol, amyl alcohol, tert-pentyl alcohol, cyclopentanol, cyclohexanol; unsaturated alcohols such as allyl alcohol, and esters such as amyl acetate or 2,2,4-triethyl pentenediol -1,3-monoisobutyrate. Preferably, the solvent comprises isopropyl alcohol or acetone.

The constituents of the metallic powder are milled until an average particle size of less than about 2 microns, and preferably less than about 1.5 microns is achieved. Once a suitable particle size has been attained, the solvent-laden metallic powder is then dried such that substantially all of the solvent is removed or separated from the metallic powder.

The metallic powder is then mixed with the organic vehicle to produce a paste utilizing conventional mixing techniques. Although the present invention contemplates milling the various constituents of the metallic powder until a suitable particle size is achieved, it will be appreciated that the present invention also contemplates purchasing or otherwise obtaining the constituents having the desired particle size, and then mixing such constituents with an organic vehicle to produce the paste. The paste is then applied to the aluminum nitride substrate 12 using conventional screen printing techniques. In order to facilitate such an application technique preferably the organic vehicle comprises about 96% terpineol and about 4% ethylcellulose, and preferably a sufficient amount of organic vehicle is utilized in producing the paste such that the metallic powder comprises about 80% to about 88% of the paste.

Although in the preferred embodiment screen printing is utilized to apply the paste to the aluminum nitride substrate 12, it will be appreciated that the present invention contemplates the use of any one of a variety of application techniques including for example, brushing, spraying, dripping, or rolling. It will be further appreciated that depending upon the technique utilized to apply the paste the amount of organic vehicle, and the amount of solvent and binder utilized in producing the organic vehicle, may have to be adjusted. For example, if the paste is to be sprayed upon the aluminum nitride substrate 12, it may be desirable to have a thinner paste which employs an additional amount of the organic vehicle comprising added amounts of solvent. Conversely, for example, if the surface of the aluminum nitride which is to be metallized is porous or rough, it may be desirable to utilize a thicker paste comprising smaller amounts of organic vehicle containing lesser amounts of solvent.

After the paste has been applied to the aluminum nitride substrate 12 in the desired pattern to a thickness of between about 0.5 and about 2 thousandths of an inch, the coated substrate 12 is then dried until the solvent contained in the paste has been substantially removed or separated from the paste. Such drying is preferably carried out at a temperature between about 75° and about 150° for a time period of between about three and about fifteen minutes.

The dried aluminum nitride substrate 12 is then fired in an oven or similar heating device. The oven has an atmosphere comprising at least one inert gas and a source of oxygen. Precautions should be undertaken to avoid an excessive amount of oxygen in the atmosphere so as to avoid over oxidation of the metallic powder contained in the paste. More particularly, a sufficient amount of oxygen must be present to oxidize the Si of the $MoSi_2$ and the Mn, while avoiding too much oxygen so as to prevent the oxidation of the Mo or the aluminum (Al) contained in the aluminum nitride. Preferably, the inert gas comprises $N_2$ so as to prevent the dissociation of the aluminum nitride. Also, preferably the source of oxygen is $H_2O$. More particularly, preferably the atmosphere comprises less than about 100 ppm $H_2O$ and displays an $H_2/H_2O$ ratio greater than about 20:1.

The coated aluminum nitride substrate should be heated such that the substrate attains an equilibrium temperature of more than about 1375°. Preferably, the coated aluminum nitride substrate 12 is heated to an equilibrium temperature of between about 1375° and about 1425° for a period of about 1 hour. If the paste contains Cu, the coated aluminum nitride substrate 12 may be heated to an equilibrium temperature of between about 1250° and about 1275° for about 1 hour. During the heating operation substantially all of the organic vehicle is removed from the paste and the metallic composition 14 is formed and bonded to the aluminum nitride substrate 12. Metallic composition 14 forms a dense hermetic metallic layer upon substrate 12.

After the heating of the aluminum nitride substrate 12, the metallic composition 14 should have a composition similar to that of the metallic powder utilized to produce the paste. More particularly, the metallic composition should comprise Mo, Si, oxygen and Mn. The metallic composition will also include Cu if Cu was utilized in producing the paste. Some of the Si may be present in the metallic composition as $MoSi_2$. Preferably, the metallic composition comprises about 60% to about 90% Mo, about 0.5% to about 15% Si, about 5% to about 20% Cu and up to about 20% Mn. More preferably, the metallic composition comprises about 60% to about 90% Mo, about .5% to about 15% $MoSi_2$, about 5% to about 20% Cu and up to about 20% Mn.

Samples prepared according to the above process have been found to display exceptional bond strengths or adhesion strengths between the metallic composition 14 and the aluminum nitride substrate 12. More particularly, samples having metallic composition 14 thicknesses of about two thousandths of an inch have exhibited adhesion strengths between the metallic composition 14 and the aluminum nitride substrate 12 in excess of 8,000 psi. Such samples were tested using the Sebastian Studpull method. This method comprises taking 0.1 inch square metallized samples, attaching an aluminum stud to the metallic composition utilizing epoxy, then pulling the stud until the aluminum nitride substrate, the epoxy or the bond between the metallic composition and the substrate fails, and then measuring the applied load at failure.

The metallic composition 14 also displays exceptional electrical conductivity with resistivity levels of less than 25 milliohms per square. The metallic composition also appears to display good thermal conductivity Furthermore, the metallic composition 14 also provides an excellent base upon which other metals such as nickel and precious metals such as silver and gold may be plated. Furthermore, the metallic composition 14 provides a superior base to which the electronic components 20 may be attached utilizing various bonding techniques including high temperature bonding techniques such as, for example, welding or brazing.

Although in the above description the metallic composition 14 has been utilized to produce a circuit board 10, it will be appreciated that the principles of the present invention may be employed to produce anyone of a variety of composite items or structures. More particularly, the metallic composition 14 may be utilized not as a conductor, but as an intermediate or filler metal for connecting or joining two or more substrates of material. Such substrates may comprise the same or different materials.

For the purposes of this specification and the claims it will be appreciated that the term "substrate" is to be construed broadly and it encompasses and includes for example, all shapes and sizes of a material, including any thickness of coating or plating. any size section or shape, such as a slab, a bar, a layer or length, or any other dimension or configuration of material.

Figure 4:
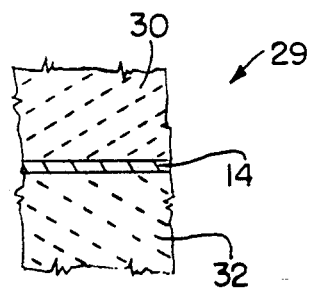
FIG. 4 is a magnified broken away cross-sectional view of a composite produced in accordance with the principles of the present invention.

In the embodiment shown in FIG. 4, the metallic composition 14 is utilized to connect or join two aluminum nitride substrates. Such a composite 29 may be applied in a variety of applications. For example, it may be desirable to produce the intake manifold of an automobile engine using aluminum nitride in order to save weight and help conduct the heat away from the cylinders of the engine. While producing such a manifold, it may be necessary to join or connect two or more substrates 30 and 32 of aluminum nitride as illustrated in FIG. 4. In such an application the metallic composition 14 serves to join the first substrate of material 30 to the second substrate of material 32.

The illustrated composite 29 may be produced by first applying the paste composition described above in connection with circuit board 10 to the first substrate of material 30 and then compressing the second substrate 32 of material against the first substrate 30 so as to sandwich the metallic composition 14 between the first and second substrates 30 and 32, then maintaining this sandwiched configuration while the combined first and second substrates of material are heated utilizing the heating process described above in connection with the circuit board 10. Alternatively, it may be possible to join the two substrates 30 and 32 by first metallizing the substrate 30 as described above in connection with the circuit board 10, and then using any one of a variety of joining techniques such as, for example, brazing or welding to join substrate 32 to the metallic composition 14.

Although the invention has bee shown and described with respect to certain preferred embodiments, it is obvious that equivalent alterations and modifications will occur to others skilled in the art upon the reading and understanding of this specification. The present invention includes all such equivalent alterations and modifications, and is limited only by the scope of the following claims.

What is claimed is:

1. A method of producing a metallized aluminum nitride substrate comprising the steps of:
   (A) applying upon an aluminum nitride substrate a layer of paste, such paste including a metallic powder, such metallic powder comprising from about 60% to about 90% by weight Mo, from about .5% to about 15% by weight $MoSi_2$, and Mn, such metallic powder comprising up to about 20% by weight Mn; and
   (B) heating the aluminum nitride substrate in an atmosphere comprising at least one inert gas and a source of oxygen.

2. A method of producing a metallized aluminum nitride substrate as set forth in claim 1 wherein the metallic powder of such paste includes copper.

3. A method of producing a metallized aluminum nitride substrate as set forth in claim 1 wherein the paste is made by:
   milling such Mo, Mn, and $MoSi_2$ in the presence of a solvent so as to produce a solvent-laden metallic powder having an average particle size of less than about 2 microns;
   drying the solvent-laden metallic powder; and
   adding at least one vehicle to the metallic powder so as to produce the paste.

4. A method of producing a metallized aluminum nitride substrate as set forth in claim 1 wherein the metallic powder of such paste includes Cu and comprises from about 5% to about 20% by weight Cu.

5. A method of producing a metallized aluminum nitride substrate as set forth in claim 4 wherein the metallic powder of such paste comprises about 67% by weight Mo, about 6% by weight $MoSi_2$, about 16% by weight Cu and about 11% by weight Mn, and the metallic powder comprises about 80% to about 88% by weight of the paste.

6. A method of producing a metallized aluminum nitride substrate as set forth in claim 1 wherein the paste includes at least one organic vehicle.

7. A method of producing a metallized aluminum nitride substrate as set forth in claim 2 wherein during said step (B) the substrate is heated to a temperature of at least 1250° C. and the atmosphere of said step (B) includes hydrogen and such source of oxygen comprises water, such atmosphere comprising less than about 100 ppm water, the ratio of the hydrogen in such atmosphere to the water in such atmosphere being in excess of about 20:1.

8. A method of producing a metallized aluminum nitride substrate as set forth in claim 11 wherein the inert gas comprises nitrogen.

9. A method of producing a metallized aluminum nitride substrate as set forth in claim 1 including the step of:
   (C) plating the metallized layer formed after the completion of said step (B) with a layer of nickel.

* * * * *